(12) United States Patent
Du (10) Patent No.: US 10,338,353 B2
(45) Date of Patent: Jul. 2, 2019

(54) WAFER LEVEL CAMERA MODULE

(71) Applicant: SAMSUNG ELECTRONICS CO., LTD., Suwon-si, Gyeonggi-do (KR)

(72) Inventor: Maohua Du, Suzhou (CN)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 372 days.

(21) Appl. No.: 15/339,487

(22) Filed: Oct. 31, 2016

(65) Prior Publication Data

US 2017/0168265 A1 Jun. 15, 2017

(30) Foreign Application Priority Data

Dec. 15, 2015 (CN) .......................... 2015 1 0933545

(51) Int. Cl.
*G02B 15/14* (2006.01)
*G02B 13/00* (2006.01)
(Continued)

(52) U.S. Cl.
CPC ........... *G02B 13/009* (2013.01); *G02B 7/102* (2013.01); *G02B 13/0085* (2013.01);
(Continued)

(58) Field of Classification Search
CPC ...... G02B 13/009; G02B 13/16; G02B 7/102; G02B 13/0085; H04N 5/23296;
(Continued)

(56) References Cited

U.S. PATENT DOCUMENTS 7,525,739 B2 4/2009 Lin
7,834,926 B2 11/2010 Minamio et al.
(Continued)

FOREIGN PATENT DOCUMENTS

CN 1967856 5/2007
CN 100545696 9/2009
(Continued)

OTHER PUBLICATIONS

Chinese Office Action issued in corresponding Chinese application No. 201510933545.2 dated Feb. 9, 2018.
(Continued)

*Primary Examiner* — Alicia M Harrington
(74) *Attorney, Agent, or Firm* — F. Chau & Associates, LLC (57) ABSTRACT

A wafer level camera module includes an image sensor including an imaging region formed on a top surface thereof, a first support layer disposed on the image sensor and having an opening, and first and second zooming units sequentially stacked having a second support layer interposed therebetween. Each zooming unit includes a piezoelectric thin film disposed on the first support layer and having an opening. Each zooming unit further includes a deformable layer disposed on the piezoelectric thin film. Each zooming unit additionally includes a lens attached to the deformable layer and positioned to overlap the imaging region. The wafer level camera module additionally includes a first conductive via penetrating through the camera module to be electrically connected to the first piezoelectric thin film. The camera module further includes a second conductive via penetrating through the camera module to be electrically connected to the second piezoelectric thin film.

20 Claims, 3 Drawing Sheets

(51) Int. Cl.
*G02B 7/10* (2006.01)
*H01L 27/146* (2006.01)
*H04N 5/225* (2006.01)
*H04N 5/232* (2006.01)
*G02B 13/16* (2006.01)

(52) U.S. Cl.
CPC ........ *G02B 13/16* (2013.01); *H01L 27/14623* (2013.01); *H01L 27/14636* (2013.01); *H04N 5/2253* (2013.01); *H04N 5/2254* (2013.01); *H04N 5/2257* (2013.01); *H04N 5/23296* (2013.01)

(58) Field of Classification Search
CPC .. H04N 5/2253; H04N 5/2257; H04N 5/2254; H04N 5/225; H01L 27/14636; H01L 27/14623; H01L 27/146
See application file for complete search history.

(56) References Cited

U.S. PATENT DOCUMENTS

| | | | |
|---|---|---|---|
| 8,190,013 | B2 | 5/2012 | Chen |
| 8,440,488 | B2 | 5/2013 | Tu et al. |
| 8,520,137 | B2 | 8/2013 | Lee et al. |
| 8,559,806 | B2 | 10/2013 | Seo |
| 9,392,152 | B2 | 7/2016 | Kim |
| 9,923,008 | B2 | 3/2018 | Wu et al. |
| 2008/0151387 | A1* | 6/2008 | Lin ........................ G02B 7/102 359/696 |
| 2010/0309368 | A1 | 12/2010 | Choi et al. |
| 2014/0285712 | A1 | 9/2014 | Kim |

FOREIGN PATENT DOCUMENTS

| | | |
|---|---|---|
| CN | 102194835 | 9/2011 |
| CN | 102547082 | 7/2012 |
| CN | 103389609 | 11/2013 |
| CN | 103579259 | 2/2014 |
| CN | 104103657 | 10/2014 |
| JP | 2010-160187 | 7/2010 |
| JP | 5035188 | 7/2012 |
| KR | 1020100027857 | 3/2010 |
| KR | 1020100134407 | 12/2010 |
| KR | 1020110071550 | 6/2011 |
| KR | 1020130024301 | 3/2013 |

OTHER PUBLICATIONS

Chinese Office Action issued in corresponding application No. 201710191864.X dated Apr. 22, 2019.

* cited by examiner

WAFER LEVEL CAMERA MODULE

CROSS-REFERENCE TO RELATED APPLICATION

This application claims priority under 35 USC §119 to Chinese Patent Application No. 201510933545.2, filed on Dec. 15, 2015, the disclosure of which is incorporated by reference herein in its entirety.

TECHNICAL FIELD

The present disclosure relates to a semiconductor package, more particularly, to a wafer level camera module.

DISCUSSION OF THE RELATED ART

As development of the camera continues, camera modules have become integrated with portable electronic devices, such as smartphones, camcorders and tablet PCs.

A wafer level camera module typically includes, among other components, an image sensor with an imaging region having a plurality of micro lenses, and two lenses (an upper and a lower) disposed in space defined by a bottom glass layer, a peripheral glass layer and two upper glass layers. Since glass is a hard and rigid material, and a mechanical driving device cannot be arranged in the wafer level package to prevent an increase in volume of the package, only a fixed-focus lens may be manufactured for the wafer level camera module. In terms of optical imaging, the fixed-focus lens has inferior performance in comparison to a zoom lens. Further, focusing may not be implemented using the above wafer level camera module.

A zoom-able camera module typically includes two lens glass layers and an electro-deforming layer interposed between the two glass layers. Further, the electro-deforming layer is deformed to perform a zooming function by a current flowing therethrough, but the deforming causes a variable thickness in the layer and the entire camera module. In the zoom-able camera module, because a plurality of groups of lenses, the zooming function is limited.

SUMMARY

According to an exemplary embodiment of the present inventive concept, a wafer level camera module includes an image sensor including an imaging region formed on a top surface thereof, a first support layer disposed on the image sensor and having a first opening, and a first zooming unit. The first zooming unit includes a first piezoelectric thin film disposed on the first support layer and having a second opening. The first zooming unit further includes a first deformable layer disposed on the first piezoelectric thin film to cover the second opening. The first zooming unit additionally includes a first lens attached to the first deformable layer and positioned to overlap the imaging region. The wafer level camera module further includes a second support layer disposed on the first deformable layer and having a third opening and a second zooming unit. The second zooming unit includes a second piezoelectric thin film disposed on the second support layer and having a fourth opening. The second zooming unit further includes a second deformable layer disposed on the second piezoelectric thin film to cover the fourth opening. The second zooming unit additionally includes a second lens attached to the second deformable layer and positioned to overlap the imaging region. The wafer level camera module additionally includes a first conductive via penetrating through the first support layer and at least a portion of the image sensor, to be electrically connected to the first piezoelectric thin film. The wafer level camera module further includes a second conductive via penetrating through the first support layer, the first piezoelectric thin film, the first deformable layer, the second support layer and at least a portion of the image sensor, to be electrically connected to the second piezoelectric thin film.

According to an exemplary embodiment of the present inventive concept, a wafer level camera module includes an image sensor including an imaging region, a first support layer disposed on the image sensor and having a first opening, and a first zooming unit. The first zooming unit includes a first piezoelectric thin film disposed on the first support layer and having a second opening. The first zooming unit further includes a first deformable layer disposed on the first piezoelectric thin film. The first zooming unit additionally includes at least one lens attached to one surface of the first deformable layer and positioned to overlap the imaging region. The wafer level camera module further includes a second support layer disposed on the first deformable layer and having a third opening and a second zooming unit. The second zooming unit includes a second piezoelectric thin film disposed on the second support layer and having a fourth opening. The second unit further includes a second deformable layer disposed on the second piezoelectric thin film. The second zooming unit additionally includes and a second lens attached to the second deformable layer and positioned to overlap the imaging region. The second lens includes a first sub lens disposed on a first surface of the second deformable layer and a second sub lens disposed on a second surface of second deformable layer. The wafer level camera module further includes a first conductive via electrically connected to the first piezoelectric thin film and a second conductive via electrically connected to the second piezoelectric thin film.

According to an exemplary embodiment of the present inventive concept, a wafer level camera module includes an image sensor including an imaging region, a first support layer disposed on the image sensor and having a first opening, and a first zooming unit disposed on the first support layer. The first zooming unit includes a first piezoelectric thin film having a second opening, a first deformable layer and a first lens attached to the first deformable layer and positioned to overlap the imaging region. The wafer level camera module further includes a second support layer disposed on the first zooming unit and having a third opening, and a second zooming unit disposed on the second support layer. The second zooming unit includes a second piezoelectric thin film having a fourth opening, a second deformable layer and a second lens attached to the second deformable layer and positioned to overlap the imaging region. The wafer level camera module further includes a first conductive via electrically connected to the first piezoelectric thin film and a second conductive via electrically connected to the second piezoelectric thin film. The wafer level camera module additionally includes a first external connection terminal disposed on a surface of the wafer level camera module to output an electric signal to an external device. The wafer level camera module further includes a third support layer disposed on the second deformable layer and having a fifth opening, and a protective layer disposed on the third support layer.

BRIEF DESCRIPTION OF THE DRAWINGS

The above and other features of the inventive concept will be more apparent by describing in detail exemplary embodiments thereof, with reference to the accompanying drawings, in which.

DETAILED DESCRIPTION OF EXEMPLARY EMBODIMENTS

Hereinafter, the inventive concept will be described in detail by explaining exemplary embodiments with reference to the accompanying drawings. The inventive concept may, however, be embodied in many different forms, and should not be construed as limited to the various embodiments set forth herein. Rather, these embodiments are provided so that this disclosure will be thorough and complete, and will fully convey the inventive concept to those skilled in the art. It will be understood that, although the terms "first", "second", "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the disclosure.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein are interpreted accordingly. In addition, it will also be understood that when a layer is referred to as being "between" two layers, it can be only layer between the two layers, or one or more intervening layers may also be present.

The term "expose" used herein may denote allowing light travelling toward a component to penetrate therethrough, e.g., not blocking the light travelling toward the component.

Hereinafter, exemplary embodiments of the present inventive concept will be described in detail with reference to the accompanying drawings.

Figure 1:
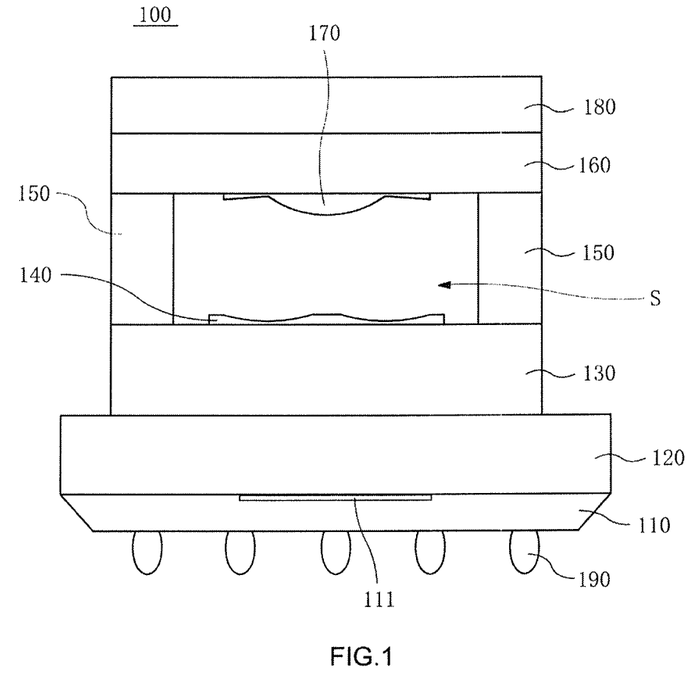
FIG. 1 is a schematic sectional view illustrating a wafer level camera module in a comparative example.

FIG. 1 is a schematic sectional view illustrating a wafer level camera module in a comparative example.

Referring to FIG. 1, a wafer level camera module 100 may include an image sensor 110 including an imaging region 111 disposed on a top surface thereof. The imaging region 111 may include a plurality of micro-lenses. The wafer level camera may additionally include a first glass layer 120 disposed on the image sensor 110 and covering the imaging region 111 of the image sensor 110. A second glass layer 130 is disposed on the first glass layer 120, and a lower lens 140 is disposed on a central portion of the second glass layer 130 to correspond to the imaging region 111. Additionally, a third glass layer 150 is disposed on a peripheral portion of the second glass layer 130 and may define a space S which accommodates the lower lens 140. A fourth glass layer 160 is disposed on the third glass layer 150 and has a lower surface which faces the space S. Further, an upper lens 170 may be attached onto the lower surface of the fourth glass layer 160 to correspond to the imaging region 111, and is facing the lower lens 140. A fifth glass layer 180 is disposed on the fourth glass layer 160, and external connection terminals 190 are disposed on a surface of the image sensor 110 opposite to the imaging region 111 to electrically connect the image sensor 110 to an external device.

Figure 2:
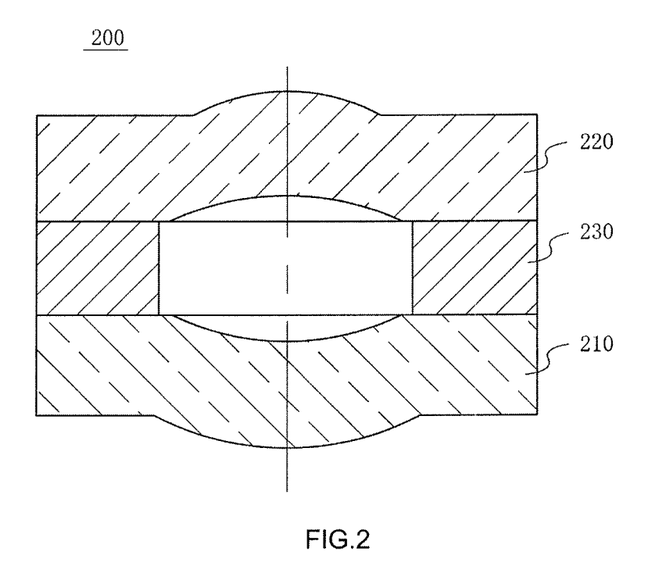
FIG. 2 is a schematic sectional view illustrating a camera module which includes an electro-deforming layer in a comparative example.

FIG. 2 is a schematic sectional view illustrating another camera module which includes an electro-deforming layer in a comparative example.

Referring to FIG. 2, a zoom-able camera module 200 may include first and second lens glass layers 210 and 220 and an electro-deforming layer 230 interposed between the first and second glass layers 210 and 220. The electro-deforming layer 230 may be deformed by a current flowing throughout the layer to cause a variable thickness in the electro-deforming layer 230 to cause a zooming function.

Figure 3:
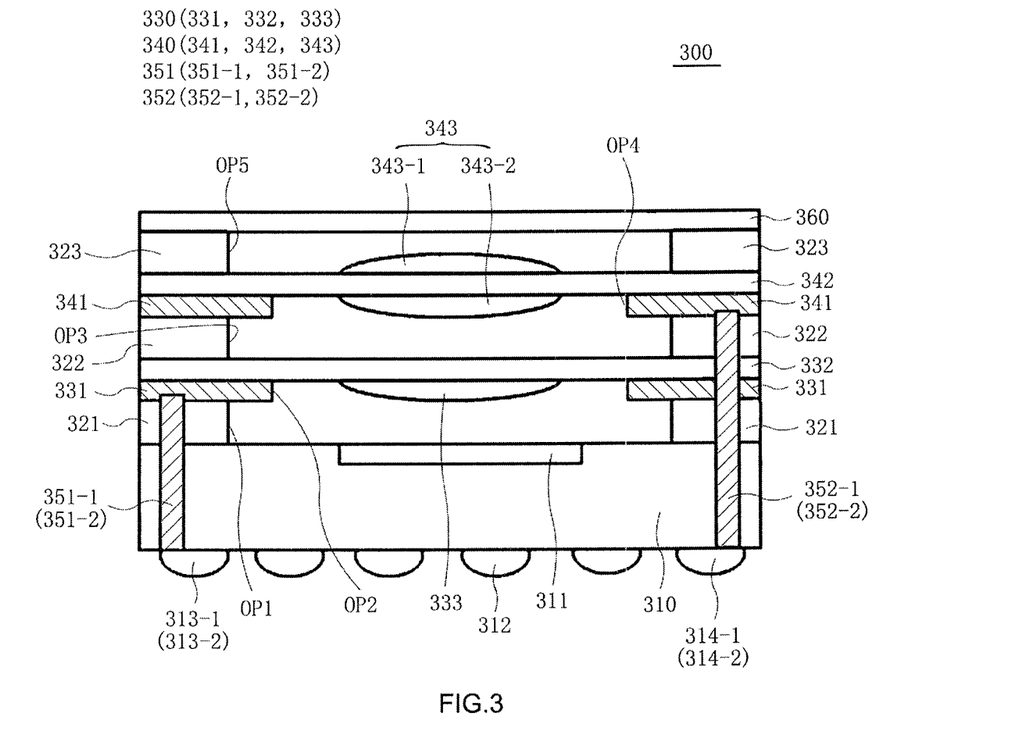
FIG. 3 is a schematic sectional view illustrating a wafer level camera module according to an exemplary embodiment of the present inventive concept.
Figure 4:
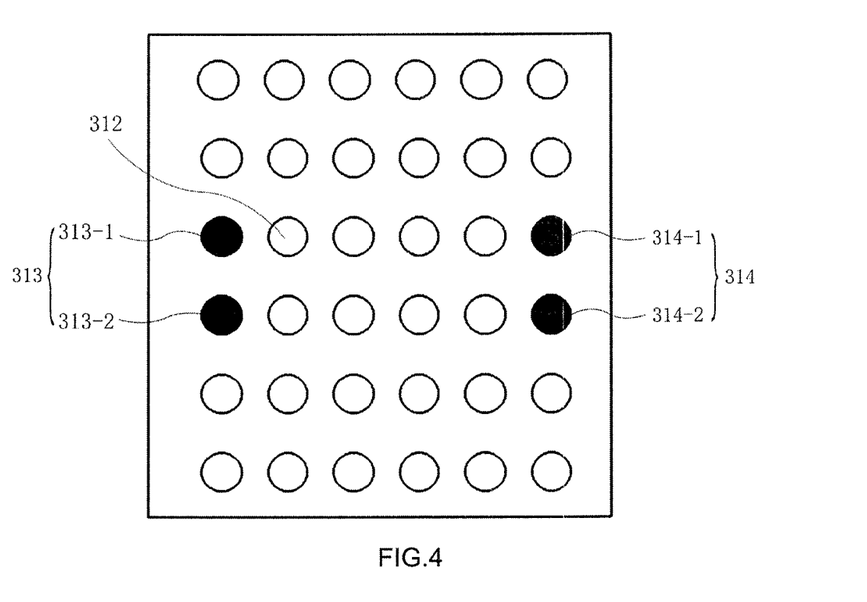
FIG. 4 is a schematic bottom view illustrating a wafer level camera module according to an exemplary embodiment of the present inventive concept.

FIG. 3 is a schematic sectional view illustrating a wafer level camera module according to an exemplary embodiment of the present inventive concept. FIG. 4 is a schematic bottom view illustrating a wafer level camera module according to an exemplary embodiment of the present inventive concept.

Referring to FIG. 3 and FIG. 4, a wafer level camera module 300 according to an exemplary embodiment of the present inventive concept may include an image sensor 310 including an imaging region 311 formed on a top surface thereof. The wafer level camera module 300 may further include a first support layer 321 disposed on the image sensor 310 and may have a first opening OH to have the imaging region 311 exposed. Additionally, a first zooming unit 330 may be included in the wafer level camera module 300. The first zooming unit 330 may include a first piezoelectric thin film 331 disposed on the first support layer 321 and may have a second opening OP2 to expose the imaging region 311. The first zooming unit may further include a first deformable layer 332 disposed on the first piezoelectric thin film 331 to cover the second opening OP2 of the first piezoelectric thin film 331, and a first lens 333 attached to the first deformable layer 332 to correspond (e.g., to be aligned) to the imaging region 311. Further, the camera module 300 may include a second support layer 322 disposed on the first deformable layer 332 and may have a third opening OP3 to expose the imaging region 311 (e.g., in addition to the first opening OP1 of the first support layer 321 to expose the imaging region 311). A second zooming unit 340 may also be included in the camera module 300. The second zooming unit 340 may include a second piezoelectric thin film 341 disposed on the second support layer 322 and may have a fourth opening OP4 to expose the imaging region 311 (e.g., in addition to the second opening OP2 of the first piezoelectric thin film 331 to expose the imaging region 311). The second zooming unit 340 may further include a second deformable layer 342 disposed on the second piezoelectric thin film 341 to cover the fourth opening OP4 of the second piezoelectric thin film 341, and a second lens 343 attached to the second deformable layer 342 corresponding to the imaging region 311(e.g., the second lens 343 may be aligned with the imaging region 311). The camera module may include first and second conductive vias 351 and 352.

The image sensor 310 may be an imaging device having an imaging region 311 formed on a top surface thereof to receive the light from the image and output the light from the image as an electrical signal. The imaging region 311 may be disposed in a central portion of the top surface of the image sensor 310. The imaging region 311 may have a plurality of micro-lenses. The image sensor 310 may further include first external connection terminals 312 disposed on a surface of the image sensor 310 opposite to the imaging region 311 to output the electrical signal converted from the light of the image to an external device. Additionally, the image sensor 310 may further include wirings electrically connecting the imaging region 311 to the first external connection terminals 312. The image sensor 310 may further include a processor to process the electrical signal converted from light of the image, and/or a memory for storing the electrical signal. The image sensor 310 may be a shape substantially similar to a rectangle, square or circle.

The image sensor 310 may be any suitable image sensor commonly used in related art. For example, an image sensor may be a charged-coupled device (CCD) image sensor or a complementary metal-oxide semiconductor (CMOS) type image sensor.

The first support layer 321 may be disposed on an edge portion of the image sensor 310. For example, the first support layer 321 may be disposed on the edge portion around the image sensor 310. In an exemplary embodiment of the present inventive concept, the first support layer 321 may be disposed on the image sensor 310 along edges of the image sensor 310 such that the first support layer 321 has a frame shape. The first support layer 321 may have the first opening OP1 to expose the imaging region 311. In an exemplary embodiment of the present inventive concept, the first support layer 321 may be disposed on the image sensor 310 so that the first opening OP1 may correspond to the central portion of the top surface of the image sensor 310. For example, the first opening OP1 and the central portion of the top surface of the image sensor 310 may be aligned with each other. The first support layer 321 may be formed of any material suitable for supporting elements arranged thereon, such as glass, silicon, plastic material or metal.

The first zooming unit 330 is disposed on the first support layer 321, and may be configured to change a focal length of a lens group included in the wafer level camera module 300. The first zooming unit 330 may include the first piezoelectric thin film 331, the first deformable layer 332 and the first lens 333.

The first piezoelectric thin film 331 is disposed on the first support layer 321, and may be disposed at an edge portion of the image sensor 310. For example, the first piezoelectric thin film 331 may be disposed on the edge portion around the image sensor 310. In an exemplary embodiment of the present inventive concept, the first piezoelectric thin film 331 may be disposed on the first support layer 321 along edges of the image sensor 310 so that the first piezoelectric thin film 331 has a frame shape. The first piezoelectric thin film 331 may be moved (e.g., deformed) in a horizontal direction (e.g., a width or length of the first piezoelectric thin film 331 may increase or decrease) and/or a vertical direction (e.g., a thickness of the first piezoelectric thin film 331 may increase or decrease). The first piezoelectric thin film 331 may include a piezoelectric material layer, and first and second electrode layers disposed on opposite (or both) surfaces of the piezoelectric material layer, respectively. The piezoelectric material layer may be made of an inorganic piezoelectric material, such as piezoelectric crystal or piezoelectric ceramics, or an organic piezoelectric material, such as polyvinylidene fluoride (PVDF) or copolymers thereof. Each of the first electrode layer and the second electrode layer may be made of metal or conductive oxide. The piezoelectric material layer is moved (e.g., deformed) in the horizontal direction and/or the vertical direction by an electric field applied from the first electrode layer and the second electrode layer, so that the first piezoelectric thin film 331 is moved in the horizontal direction and/or the vertical direction. For example, the length and thickness of the first piezoelectric thin film 331 may increase when the electric field is applied from the first electrode layer and the second electrode layer.

The first piezoelectric thin film 331 may have the second opening OP2 to expose the imaging region 311 to form a space for receiving light of an image that passes through the first lens 333. The second opening OP2 of the first piezoelectric thin film 331 may be smaller than the first opening OP1 of the first support layer 321 to facilitate the movement of the first piezoelectric thin film 331. For example, the area of the second opening OP2 may be smaller than the area of the first opening OP1.

The first deformable layer 332 is disposed on the first piezoelectric thin film 331 to cover the second opening OP2 of the first piezoelectric thin film 331. The first deformable layer 332 may be extended from a side of the first piezoelectric thin film 331 to another side of the first piezoelectric thin film 331 opposite to the previous side. For example, the first deformable layer 332 may entirely cover the second opening OP2 of the first piezoelectric thin film 331. Because the first deformable layer 332 is disposed on the first piezoelectric thin film 331, the first deformable layer 332 may be moved (e.g., deformed) in a horizontal direction (e.g., a width or length of the first deformable layer 332 may increase or decrease) and/or a vertical direction (e.g., a thickness of the first deformable layer 332 may increase or decrease) by electro-deformation of the first piezoelectric thin film 331. The first deformable layer 332 may be made of a transparent plastic having flexibility, such as polypropylene (PP), polyvinyl chloride (PVC), polystyrene (PS), polymethyl methacrylate (PMMA) or polycarbonate (PC) so that it may be deformed easily by the electro-deformation of the first piezoelectric thin film 331.

The first lens 333 is attached to the first deformable layer 332 corresponding to the imaging region 311 (e.g., facing the imaging region 311). The first lens 333 may be disposed in the space defined by the second opening OP2 of the first piezoelectric thin film 331. The first lens 333 may be disposed on a surface of the first deformable layer 332 facing the imaging region 311 (e.g., a lower surface) as shown in FIG. 3. However, the present disclosure is not limited thereto. For example, the first lens 333 may be disposed on a surface of the first deformable layer 332 opposite the imaging region 311 (e.g., an upper surface of the first deformable layer 332). Although FIG. 3 shows that the first zooming unit 330 includes one first lens 333 disposed on the lower surface of the first deformable layer 332, the present disclosure is not limited thereto. For example, the first zooming unit 330 may include two lenses: one lens disposed on the upper surface and the other lens disposed on the lower surface of the first deformable layer 332. The first lens 333 may be made of, for example, glass or plastic.

The first lens 333 may be moved according to the movement (e.g., deformation) of the first deformable layer 332. In an exemplary embodiment of the present inventive concept, the first lens 333 may be moved in a vertical direction (e.g., a direction toward the imaging region 311 or away from the imaging region 311) according to the movement (e.g., deformation) of the first deformable layer 332, e.g., upward and downward movements. In an exemplary embodiment of the present inventive concept, the first lens 333 may be moved according to the movement of the first deformable layer 332.

The second support layer 322 may be disposed on an edge portion of the first deformable layer 332. For example, the second support layer 322 may be disposed on the edge portion around the first deformable layer 332. In an exemplary embodiment of the present inventive concept, the second support layer 322 may be disposed on the first deformable layer 332 along edges of the first deformable layer 332 such that the second support layer 322 has a shape similar to a frame. The second support layer 322 has the third opening OP3 to expose the imaging region 311. The third opening OP3 may be overlapped with the first opening OP1 of the first support layer 321, and may have substantially the same size as the first opening OP1 of the first support layer 321. For example, the area of the third opening OP3 may be substantially the same as the area of the first opening. In an exemplary embodiment of the present inventive concept, the third opening OP3 may be formed corresponding to the central portion of the top surface of the image sensor 310 (e.g., the third opening OP3 may be aligned with the image sensor 310). The second support layer 322 may be formed of any material suitable for supporting elements arranged thereon, such as glass, silicon, plastic material or metal.

The second support layer 322 may have substantially the same arrangement and structure as the first support layer 321.

The second zooming unit 340 is disposed on the second support layer 322, and may be configured to change the focal length of the lens group included in the wafer level camera module 300. The second zooming unit 340 may include the second piezoelectric thin film 341, the second deformable layer 342 and the second lens 343.

The second piezoelectric thin film 341 is disposed on the second support layer 322, and may be disposed at an edge portion of the image sensor 310. For example, the second piezoelectric thin film 341 may be disposed on the edge portion around the image sensor 310. In an exemplary embodiment, the second piezoelectric thin film 341 may be disposed on the second support layer 322 along edges of the image sensor 310 so that the second piezoelectric thin film 341 has a frame shape. The second piezoelectric thin film 341 may be moved (e.g., deformed) in a horizontal direction (e.g., a width or length of the second piezoelectric thin film 341 may increase or decrease) and/or a vertical direction (e.g., a thickness of the second piezoelectric thin film 341 may increase or decrease). The second piezoelectric thin film 341 may include a piezoelectric material layer, and third and fourth electrode layers disposed on opposite (or both) surfaces of the piezoelectric material layer, respectively. The piezoelectric material layer may be made of an inorganic piezoelectric material, such as piezoelectric crystal or piezoelectric ceramics, or an organic piezoelectric material, such as polyvinylidene fluoride (PVDF) or copolymers thereof. Each of the third electrode layer and the fourth electrode layer may be made of metal or conductive oxide. The piezoelectric material layer is moved (e.g., deformed) in the horizontal direction and/or the vertical direction by an electric field applied from the third electrode layer and the fourth electrode layer, so that the second piezoelectric thin film 341 is moved in the horizontal direction and/or the vertical direction. For example, the length and thickness of the second piezoelectric thin film 341 may increase when the electric field is applied from the third electrode layer and the fourth electrode layer.

The second piezoelectric thin film 341 may have the fourth opening OP4 to expose the imaging region 311 to form a space for receiving light of an image that passes through the second lens 333. The fourth opening OP4 of the second piezoelectric thin film 341 may overlap the second opening OP2 of the first piezoelectric thin film 331, and may have substantially the same size as the second opening OP2 of the first piezoelectric thin film 331. For example, the area of the fourth opening OP4 may have substantially the same area as the area of the second opening OP2.

The fourth opening OP4 of the second piezoelectric thin film 341 may be smaller than the first opening OP1 of the first support layer 321 and the third opening OP3 of the second support layer 322 to facilitate the movement of the second piezoelectric thin film 341. For example, the area of the fourth opening OP4 may be smaller than the area of the first opening OP1 and the area of the third opening OP3.

The second piezoelectric thin film 341 may have substantially the same arrangement and structure as the first piezoelectric thin film 331.

The second deformable layer 342 is disposed on the second piezoelectric thin film 341 to cover the fourth opening OP4 of the second piezoelectric thin film 341. The second deformable layer 342 may be extended from a side of the second piezoelectric thin film 341 to another side of the second piezoelectric thin film 341 opposite to the previous side. For example, the second deformable layer 342 may entirely cover the fourth opening OP4 of the second piezoelectric thin film 341. Because the second deformable layer 342 is disposed on the second piezoelectric thin film 341, the second deformable layer 342 may be moved (e.g., deformed) in a horizontal direction (e.g., a width or length of the second deformable layer 342 may increase or decrease) and/or a vertical direction (e.g., a thickness of the second deformable layer 342 may increase or decrease) by electro-deformation of the second piezoelectric thin film 341. The second deformable layer 342 may be made of a transparent plastic having flexibility, such as polypropylene (PP), polyvinyl chloride (PVC), polystyrene (PS), polymethyl methacrylate (PMMA) or polycarbonate (PC) so that it may be deformed easily by the electro-deformation of the second piezoelectric thin film 341.

The second deformable layer 342 may have substantially the same arrangement and structure as the first deformable layer 332.

The second lens 343 is attached to the second deformable layer 342 corresponding to the imaging region 311. The second lens 343 may include a first sub-lens 343-1 disposed on a surface of the second deformable layer 342 opposite to the imaging region 311 (e.g., an upper surface) and a second sub-lens 343-2 disposed on a surface of the second deformable layer 342 facing the imaging region 311 (e.g., a lower surface). The second sub-lens 343-2 may be disposed in the space defined by the fourth opening OP4 of the second piezoelectric thin film 341. In an exemplary embodiment of the present inventive concept, the second zooming unit may include only a second lens which is disposed on the surface of the second deformable layer 342 opposite the imaging region 311 (e.g., the upper surface of the second deformable layer 342) or only a second lens which is disposed on the surface of the second deformable layer 342 facing the imaging region 311 (e.g., the lower surface of the second deformable layer 342). The second lens 343 may be made of, for example, glass or plastic.

The second lens 343 may be moved according to the movement (e.g., deformation) of the second deformable layer 342. In an exemplary embodiment of the present inventive concept, the second lens 343 may be moved in a vertical direction (e.g., a direction toward the imaging region 311 or away from the imaging region 311) according to the movement (e.g., deformation) of the second deformable layer 342, e.g., upward and downward movements. In an exemplary embodiment of the present inventive concept, the second lens 343 may be moved according to the movement of the second deformable layer 342.

Further, the second lens 343 may have an optical axis. The second lens 343 may be aligned with the first lens 333 so that the optical axis of the second lens 343 coincides or aligns with an optical axis of the first lens 333. Each of the optical axis of the first lens 333 and the optical axis of the second lens 343 may pass through the imaging region 311, for example, a center of the imaging region 311.

The first conductive via 351 penetrates through (e.g., vertically penetrates through) multiple layers of the camera module 300. The first conductive via 351 may penetrate at least a portion of the image sensor 310 where the imaging region 311 is not disposed. The first conductive via 351 may penetrate the first support layer 321 so that the first conductive via 351 is electrically connected to the first piezoelectric thin film 331 to supply a driving voltage to the first piezoelectric thin film 331. The first conductive via 351 may penetrate through the image sensor 310 from a surface of the image sensor 310 opposite to the imaging region 311 and extend to a surface of the image sensor 310 where the imaging region 311 is disposed. The first conductive via 351 may be made of metal, such as copper, tungsten or titanium.

As described above, the first piezoelectric thin film 331 may include the piezoelectric material layer and the first and second electrode layers disposed on the opposite surfaces of the piezoelectric material layer, respectively. For example, the first electrode is disposed on the lower surface of the piezoelectric material layer, and the second electrode is disposed on the upper surface. The first conductive via 351 may include a first conductive sub-via 351-1 electrically connected to (e.g., electrically contacting) the first electrode layer of the first piezoelectric thin film 331. Additionally, the first conductive via 351 may include a second conductive sub-via 351-2 electrically connected to (e.g., electrically contacting) the second electrode layer of the first piezoelectric thin film 331. Both conductive sub-vias 351-1 and 351-2 are connected to their respective electrodes so that respective driving voltages for driving the piezoelectric material layer are applied to the first and second electrode layers.

The image sensor 310 may further include a second external connection terminal 313 which is disposed on the surface of the image sensor 310 opposite to the imaging region 311. The second external connection terminal may be electrically connected to (e.g., electrically contacting) the first conductive via 351. The second external connection terminal 313 may be, for example, a solder ball. The second external connection terminal 313 may include second external connection sub-terminals 313-1 and 313-2 electrically connected to (e.g., electrically contacting) the first and second conductive sub-vias 351-1 and 351-2, respectively.

The second conductive via 352 may penetrate through (e.g., vertically penetrates through) multiple layers of the camera module 300. The second conductive via 352 may penetrate at least a portion of the image sensor 310 where the imaging region 311 is not disposed. The second conductive via 352 may further penetrate the first support layer 321, the first piezoelectric thin film 331, the first deformable layer 332 and the second support layer 322. The second conductive via 352 may penetrate the second support layer 322 to be electrically connected to the second piezoelectric thin film 341, so that a driving voltage is supplied to the second piezoelectric thin film 341. The second conductive via 352 may penetrate through the image sensor 310 from the surface of the image sensor 310 opposite to the imaging region 311 and extend to the surface of the image sensor 310 where the imaging region 311 is disposed. The second conductive via 352 may be made of metal, such as copper, tungsten or titanium.

As described above, the second piezoelectric thin film 341 may include the piezoelectric material layer and the third and fourth electrode layers disposed on the opposite surfaces of the piezoelectric material layer, respectively. For example, the third electrode is disposed on the lower surface of the piezoelectric material layer, and the fourth electrode is disposed on the upper surface. The second conductive via 352 may include a third conductive sub-via 352-1 electrically connected to (e.g., electrically contacting) the third electrode layer of the second piezoelectric thin film 341. Additionally, the second conductive via 352 may include a fourth conductive sub-via 352-2 electrically connected to (e.g., electrically contacting) the fourth electrode layer of the second piezoelectric thin film 341. Both conductive sub-via 352-1 and 352-2 are connected to their respective electrodes so that respective driving voltages for driving the piezoelectric material layer are applied to the third and fourth electrode layers.

The image sensor 310 may further include a third external connection terminal 314 which is disposed on the surface of the image sensor 310 opposite to the imaging region 311. The third external connection terminal 314 may be electrically connected to (e.g., electrically contacting) the second conductive via 352. The third external connection terminal 314 may be, for example, a solder ball. The third external connection terminal 314 may include third external connection sub-terminals 314-1 and 314-2 electrically connected to (e.g., electrically contacting) the third and fourth conductive sub-vias 352-1 and 352-2, respectively.

Here, although the second conductive via 352 penetrates through the first piezoelectric thin film 331, the second conductive via 352 is not electrically connected to the first piezoelectric thin film 331. The second conductive via 352 may be insulated from the first piezoelectric thin film 331. For example, an insulation layer may be disposed between the second conductive via 352 and the first piezoelectric thin film 331.

A plurality of the first external connection terminals 312 may be disposed at a central portion of the surface of the image sensor 310 opposite to the imaging region 311. The second and third external connection terminals 313 and 314 may be disposed at an edge or periphery of the surface of the image sensor 310 opposite to the imaging region 311. For example, the second and third external connection terminals 313 and 314 are disposed around the first external connection terminals 312.

The wafer level camera module 300 according to an exemplary embodiment of the present inventive concept may further include a third support layer 323 and a protective layer 360 disposed on the third support layer 323.

The third support layer 323 is disposed on the second deformable layer 342 and may have a fifth opening OP5 to expose the imaging region 311 (e.g., overlapping the first opening OP1 of the first support layer 321 and the third opening OP3 of the second support layer 322). The third support layer 323 may be disposed on an edge portion of the second deformable layer 342. For example, the third support layer 323 may be disposed on the edge portion around the second deformable layer 342. In an exemplary embodiment of the present inventive concept, the third support layer 323 may be disposed on the second deformable layer 342 along edges of the second deformable layer 342 such that the third support layer 323 has a frame shape. The fifth opening OP5 may have substantially the same size as the first opening OP1 of the first support layer 321 and the third opening OP3 of the second support layer 322. For example, the area of the fifth opening OP5 may be substantially the same as the area of the first opening OP1 and the third opening OP3. In an exemplary embodiment of the present inventive concept, the fifth opening OP5 may be formed corresponding to the central portion of the top surface of the image sensor 310. (e.g., the fifth opening OP5 may be aligned with the image sensor 310). For example, the fifth opening OP5 may also be aligned with the imaging region 311. The third support layer 323 may be formed of any material suitable for supporting elements arranged thereon, such as glass, silicon, plastic material or metal.

The protective layer 360 is disposed on the third support layer 323 to cover the wafer level camera module 300. For example, the protective layer 360 covers the fifth opening OP5 of the third support layer 323 to protect the wafer level camera module 300 from being affected by, for example, moisture, oxygen or an external impact. The protective layer 360 may be extended from a side of the third support layer 323 to another side of the third support layer 323 opposite to the side. For example, the protective layer 360 may entirely cover the fifth opening OP5 of the third support layer 323. The protective layer 360 may be made of, for example, glass or transparent plastic.

The wafer level camera module 300 according to an exemplary embodiment of the present inventive concept may further include a light shielding layer disposed on at least an edge portion of the protective layer 360. For example, the light shielding layer may be disposed on a portion of the protective layer 360 which is in contact with the third support layer 323. The light shielding layer may further cover a surface (e.g., a side) of the wafer level camera module 300. For example, the light shielding layer may cover surfaces of the first support layer 321, the first piezoelectric thin film 331, the first deformable layer 332, the second support layer 322, the second piezoelectric thin film 341, the second deformable layer 342, the third support layer 323 and the protective layer 360 which are stacked sequentially. The light shielding layer may prevent a reduction in image quality as a result of excessive light entering the wafer level camera module 300.

Figure 5:
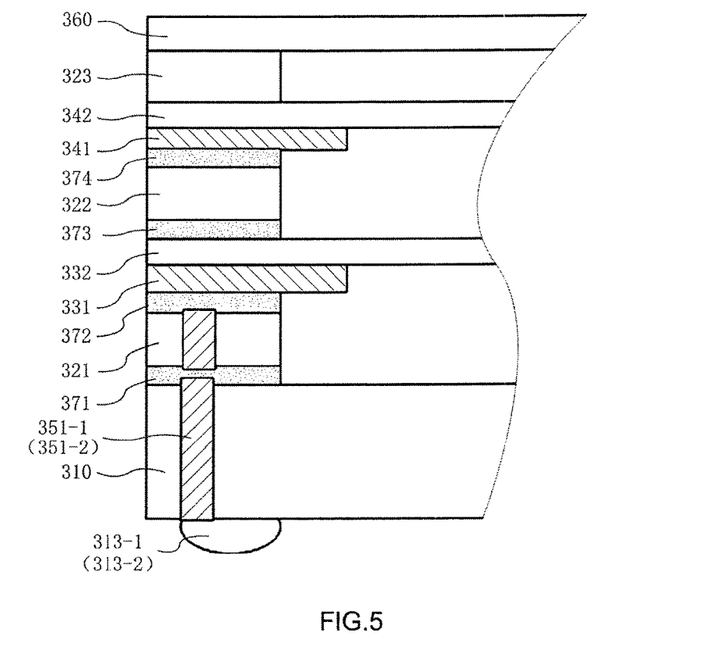
FIG. 5 is a schematic partially sectional view for describing a method of manufacturing a wafer level camera module according to an exemplary embodiment of the present inventive concept.

Hereinafter, a method of manufacturing the wafer level camera module 300 according to an exemplary embodiment of the present inventive concept will be described. FIG. 5 is a schematic partial sectional view for describing a manufacturing method of a wafer level camera module according to an exemplary embodiment of the present inventive concept.

Referring to FIG. 5, the wafer level camera module 300 may be manufactured by aligning and stacking the first support layer 321 on the image sensor 310. The first piezoelectric thin film 331 may be aligned and stacked on the first support layer 321. The first deformable layer 332 having the first lens 333 formed thereon may be stacked on the first piezoelectric thin film 331. The second support layer 322 may be aligned and stacked on first deformable layer 332. The second piezoelectric thin film 341 may be stacked on the second support layer 322. The second deformable layer 342 may be aligned and stacked on the second piezoelectric thin film 341. The second deformable layer 342 may have the second lens 343 formed thereon in which conductive vias have been formed.

In an exemplary embodiment of the present inventive concept, the first support layer 321 may be aligned and stacked on the image sensor 310. The first deformable layer 332 having the first piezoelectric thin film 331 and the first lens 333 formed thereon may be stacked and aligned on the first support layer 321. The second support layer 322 may be aligned and stacked on the first deformable layer 332. The second deformable layer 342 having the second piezoelectric thin film 341 maybe aligned and stacked on the second support layer 322. The second deformable layer 342 may have the second lens 343 formed thereon in which the second conductive via 352 have been formed.

In an exemplary embodiment of the present inventive concept, a first anisotropic conductive adhesive 371 may be disposed between the image sensor 310 and the first support layer 321. Further, a second anisotropic conductive adhesive 372 may be disposed between the first support layer 321 and the first piezoelectric thin film 331. Additionally, a third anisotropic conductive adhesive 373 may be disposed between the first deformable layer 332 and the second support layer 322. A fourth anisotropic conductive adhesive 374 may be disposed between the second support layer 322 and the second piezoelectric thin film 341. Parts of the wafer level camera module 300 that are connected by respective anisotropic conductive adhesives are pressed together such that the first conductive via 351 and the second conductive via 352 are formed. For example, the image sensor 310 and the first support layer, connected by the first anisotropic conductive adhesive, are pressed towards each other such that the first conductive via 351 is formed. In an exemplary embodiment of the present inventive concept, a solder may be used instead of the anisotropic conductive adhesive.

Conductive vias (e.g., 351 and 352) may be formed in the first support layer 321, the first piezoelectric thin film 331, the first deformable layer 332, the second support layer 322, the second piezoelectric thin film 341 and the second deformable layer 342. The conductive vias (e.g., 351 and 352) may be manufactured by forming (e.g., by etching or drilling) through-holes in respective components and filling the through-holes with a conductive material.

In an exemplary embodiment of the present inventive concept, the third support layer 323 and the protective layer 360 may further be stacked on the image sensor 310 sequentially.

In addition, the wafer level camera module 300 may be manufactured by aligning and sequentially stacking the first support layer 321 on the image sensor 310. In addition, the first piezoelectric thin film 331 may be aligned and stacked on the first support layer 321. Further, the first deformable layer 332 having the first lens 333 formed thereon may be aligned and stacked on the first piezoelectric thin film 331. Additionally, the second support layer 322 may be aligned and stacked on the first deformable layer 332 having the first lens 333 formed thereon. Further, the second piezoelectric thin film 341 may be aligned and stacked on the second support layer 322. The second deformable layer 342 having the second lens 343 formed thereon may be aligned and stacked on the second piezoelectric thin film 341

In an exemplary embodiment of the present inventive concept, the first support layer 321 may be aligned and stacked on the image sensor 310. In addition, the first deformable layer 332 may be aligned and stacked on the first support layer 321. The first deformable layer 332 may have the first piezoelectric thin film 331 and the first lens 333 formed thereon. Further, the second support layer 322 may be aligned and stacked on the first deformable layer 332. Additionally, the second deformable layer 342 may be aligned and stacked on the second support layer 322. The second deformable layer 342 may have the second piezoelectric thin film 341 and the second lens 343 formed thereon.

In an exemplary embodiment of the present inventive concept, the manufacturing of the wafer camera module may further include forming through-holes in the stacked structure. The manufacturing may also include filling respective through-holes with a conductive material. In this case, non-conductive adhesive layers may be disposed between respective layers stacked with each other.

The first through third external connection terminals 312 to 314 may be formed before or after stacking respective components on the surface of the image sensor 310 on which the imaging region 311 is formed.

Figure 6:
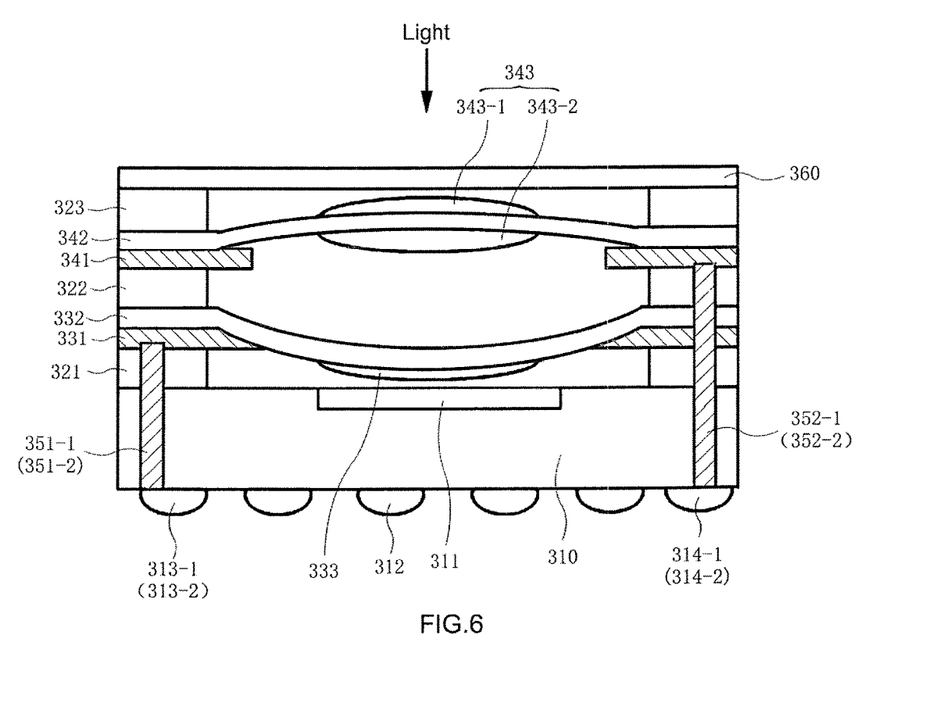
FIG. 6 is a schematic sectional view for describing a zooming operation performed by a wafer level camera module which is illustrated in FIG. 3 according to an exemplary embodiment of the present inventive concept.

Hereinafter, a method of operating the wafer level camera module 300 according to an exemplary embodiment of the present inventive concept will be described. FIG. 6 is a schematic sectional view for describing a zooming operation performed by the wafer level camera module 300 which is illustrated in FIG. 3 according to an exemplary embodiment of the present inventive concept.

Referring to FIG. 6, the second external connection terminal 313 connected to an external device (e.g., a control device) receives a driving voltage from the external device. The driving voltage is supplied to the first piezoelectric thin film 331 through the first conductive via 351. For example, a first voltage may be supplied to the first electrode layer of the first piezoelectric thin film 331 through the first conductive sub-via 351-1 connected to the second external connection sub-terminal 313-1. Further, second voltage different form the first voltage may be supplied to the second electrode layer of the first piezoelectric thin film 331 through the second conductive sub-via 351-2 connected to the second external connection sub-terminal 313-2. Therefore, the first piezoelectric thin film 331 is moved by a driving voltage according to a difference between the first voltage and the second voltage. As a result, the first deformable layer 332 attached to the first piezoelectric thin film 331 is moved (e.g., deformed) by the movement of the first piezoelectric thin film 331. For example, the first piezoelectric thin film 331 is moved (e.g., deformed) in the horizontal direction (e.g., the width or length of the first piezoelectric thin film 331 may increase or decrease) and/or the vertical direction (e.g., the thickness of the first piezoelectric thin film 331 may increase or decrease) by the driving voltage; as a result of the movement of the first piezoelectric thin film 331, the first deformable layer 332 attached to the first piezoelectric thin film 331 is moved (e.g., deformed) in the horizontal direction (e.g., the width or length of the first deformable layer 332 may increase or decrease) and/or the vertical direction (e.g., the thickness of the first deformable layer 332 may increase or decrease). As shown in FIG. 6, two sides of the first deformable layer 332 are moved toward each other so that the first deformable layer 332 is bent toward the imaging region 311.

At least a portion of the first piezoelectric thin film 331 is pressed between the first support layer 321 and the second support layer 322. As a result, at least the portion of the first piezoelectric thin film 331 may be fixed, relatively, while at least another portion of the first piezoelectric thin film 331 is moved.

With the movement of the first deformable layer 332, the first lens 333 attached to the first deformable layer 332 is also moved. For example, the first lens 333 may be moved in the vertical direction. As shown in FIG. 6, the first lens 333 is moved toward the imaging region 311. In an exemplary embodiment of the present inventive concept, the first lens 333 may be deformed according to the movement of the first deformable layer 332. When the driving voltage is no longer applied, the first piezoelectric thin film 331, the first deformable layer 332 and the first lens 333 may be restored to their initial positions and/or shapes.

Referring to FIG. 6, the third external connection terminal 314 connected to an external device (e.g., a control device) may receive a driving voltage from the external device. The driving voltage may be supplied to the second piezoelectric thin film 341 through the second conductive via 352. In addition, a third voltage may be supplied to the third electrode layer of the second piezoelectric thin film 341 through the third conductive sub-via 352-1 connected to the third external connection sub-terminal 314-1. A fourth voltage, different form the third voltage, may be supplied to the fourth electrode layer of the second piezoelectric thin film 341 through the fourth conductive sub-via 352-2 which is connected to the third external connection sub-terminal 314-2. Therefore, the second piezoelectric thin film 341 is moved by a driving voltage according to a difference between the third voltage and the fourth voltage. As a result, the second deformable layer 342 attached to the second piezoelectric thin film 341 is moved (e.g., deformed) by the movement of the second piezoelectric thin film 341. For example, the second piezoelectric thin film 341 is moved (e.g., deformed) in the horizontal direction (e.g., the width or length of the second piezoelectric thin film 341 may increase or decrease) and/or the vertical direction (e.g., the thickness of the second piezoelectric thin film 341 may increase or decrease) by the driving voltage. As a result, the second deformable layer 342 attached to the second piezoelectric thin film 341 is moved (e.g., deformed) in the horizontal direction (e.g., the width or length of the second deformable layer 342 may increase or decrease) and/or the vertical direction (e.g., the thickness of the second deformable layer 342) by the movement of the second piezoelectric thin film 341. As shown in FIG. 6, two sides of the second deformable layer 342 are moved toward each other so that the second deformable layer 342 is bent far away from the imaging region 311. For example, a central portion of the second deformable layer 342 may be bent away from the imaging region 311.

At least a portion of the second piezoelectric thin film 341 is pressed between the second support layer 322 and the third support layer 323. As a result, at least the portion of the second piezoelectric thin film 341 may be fixed, relatively, while at least another portion of the second piezoelectric thin film 341 is moved.

With the movement of the second deformable layer 342, the second lens 343 which is attached to the second deformable layer 342 is also moved. For example, the second lens 343 may be moved in the vertical direction. As shown in FIG. 6, the second lens 343 is moved far away from the imaging region 311. In an exemplary embodiment of the present inventive concept, the second lens 343 may be deformed according to the movement of the second deformable layer 342. When the driving voltage is no longer applied, the second piezoelectric thin film 341, the second deformable layer 342 and the second lens 343 may be restored to their initial positions and/or shapes.

Light from an external environment passes through the first lens 333 and the second lens 343 to be incident on the imaging region 311 of the image sensor 310. The image sensor 310 generates an image from the received light and the image is output to an external device, e.g., an image processor or a memory, through the first external connection terminals 312, as an electrical signal.

Due to the movements of the first lens 333 and/or the second lens 343, a distance between the first lens 333 and the second lens 343 has changed so that a focal length of a lens group including the first lens 333 and the second lens 343 is changed. Therefore, compared with a fixed-focus lens, the wafer level camera module 300 according to an exemplary embodiment of the present inventive concept has excellent performance in terms of optical imaging.

Although an exemplary embodiment of the present inventive concept in which each of the first lens 333 and the second lens 343 is moved has been described above, the present disclosure is not limited thereto. For example, one of the first lens 333 and the second lens 343 may be moved, while the other of the first lens 333 and the second lens 343 may be maintained in place and not moved.

Although the moving directions of the first lens 333 and the second lens 343 have been described above with reference to FIG. 6, the present disclosure is not limited thereto. For example, the lenses of the lens group included in the wafer level camera module 300 may be moved variously.

In addition, focusing of the lens group including the first lens 333 and the second lens 343 may be implemented by the first lens 333 and/or the second lens 343 moving. Therefore, the wafer level camera module 300 according to an exemplary embodiment of the present inventive concept has excellent performance in terms of optical imaging.

Although an exemplary embodiment of the present inventive concept in which the focal length of one group of lenses including the first lens 333 and the second lens 343 is changed in the wafer level camera module 300 according to an exemplary embodiment of the present inventive concept has been described above, the present disclosure is not limited thereto. In addition to the first zooming unit 330 and the second zooming unit 340, the wafer level camera module according to an exemplary embodiment of the present inventive concept may further include an additional zooming unit(s) having substantially the same arrangement or structure as the first zooming unit 330 or the second zooming unit 340. For example, the wafer level camera module according to an exemplary embodiment of the present inventive concept may further include a third zooming unit disposed on the second zooming unit 340 and having substantially the same arrangement or structure as the first zooming unit 330 or the second zooming unit 340. For example, the wafer level camera module according to an exemplary embodiment of the present inventive concept may further include third and fourth zooming units disposed on the second zooming unit 340 and having substantially the same arrangements or structures as the first zooming unit 330 or the second zooming unit 340. Further, the third zooming unit is disposed on the second zooming unit 340, and the fourth zooming unit is disposed on the third zooming unit. Therefore, the wafer level camera module including at least two zooming units may have a plurality of groups of lenses, and each of the plurality of groups of lenses includes at least two lenses. Thus, zooming may be implemented by a plurality of groups of lenses. In addition, focusing may also be implemented by a plurality of groups of lenses.

Further, since the first piezoelectric thin film 331 and/or the second piezoelectric thin film 341 has a relatively small thickness, the wafer level camera module 300 has a substantially constant entire thickness, e.g., an entire thickness having a minute variation, when the zooming and/or the focusing is performed by the electro-deformation of the first piezoelectric thin film 331 and/or the second piezoelectric thin film 341. Therefore, it is not necessary to provide an additional protective housing for receiving the wafer level camera module 300 to mount the wafer level camera module 300 in, for example, a portable electronic device, thereby implementing a wafer level package readily.

While the present disclosure has been described in connection with the accompanying drawings and exemplary embodiments, the present disclosure is not limited to the disclosed exemplary embodiments, but, on the contrary, is intended to cover various modifications and equivalent arrangements included within the spirit and scope of the appended claims.

What is claimed is:

1. A wafer level camera module, comprising:
    an image sensor including an imaging region formed on a top surface thereof;
    a first support layer disposed on the image sensor and having a first opening;
    a first zooming unit including:
        a first piezoelectric thin film disposed on the first support layer and having a second opening;
        a first deformable layer disposed on the first piezoelectric thin film to cover the second opening; and
        a first lens attached to the first deformable layer and positioned to overlap the imaging region;
    a second support layer disposed on the first deformable layer and having a third opening;
    a second zooming unit including:
        a second piezoelectric thin film disposed on the second support layer and having a fourth opening;
        a second deformable layer disposed on the second piezoelectric thin film to cover the fourth opening; and
        a second lens attached to the second deformable layer and positioned to overlap the imaging region;
    a first conductive via penetrating through the first support layer and at least a portion of the image sensor, to be electrically connected to the first piezoelectric thin film; and
    a second conductive via penetrating through the first support layer, the first piezoelectric thin film, the first deformable layer, the second support layer and at least a portion of the image sensor, to be electrically connected to the second piezoelectric thin film.

2. The wafer level camera module of claim 1, wherein the image sensor further includes a first external connection terminal disposed on a bottom surface of the image sensor to output an electric signal, which is converted from light, to an external device.

3. The wafer level camera module of claim 1, wherein the first piezoelectric thin film includes a first piezoelectric material layer, wherein a first electrode layer and a second electrode layer are disposed on opposite surfaces of the first piezoelectric material layer, respectively.

4. The wafer level camera module of claim 3, wherein the first conductive via includes a first conductive sub-via electrically connected to the first electrode layer and a second conductive sub-via electrically connected to the second electrode layer, and
wherein the image sensor further includes a second external connection terminal and a third external connection terminal disposed on a bottom surface of the image sensor and electrically connected to the first conductive sub-via and the second conductive sub-via, respectively.

5. The wafer level camera module of claim 1, wherein the second piezoelectric thin film includes a second piezoelectric material layer, wherein a third electrode layer and a fourth electrode layer are disposed on opposite surfaces of the second piezoelectric material layer, respectively.

6. The wafer level camera module of claim 5, wherein the second conductive via includes a third conductive sub-via electrically connected to the third electrode layer and a fourth conductive sub-via electrically connected to the fourth electrode layer, and
the image sensor further includes a fourth external connection terminal and a fifth external connection terminal disposed on a bottom surface of the image sensor and electrically connected to the third conductive sub-via and the fourth conductive sub-via, respectively.

7. The wafer level camera module of claim 1, further comprising:
a third support layer disposed on the second deformable layer and having a fifth opening; and
a protective layer disposed on the third support layer to cover the fifth opening.

8. The wafer level camera module of claim 7, further comprising a light shielding layer disposed on at least an edge portion of the protective layer.

9. The wafer level camera module of claim 1, wherein the first piezoelectric thin film is deformed so that the first deformable layer is deformed and the first lens is moved, when a driving voltage is applied to the first piezoelectric thin film through the first conductive via.

10. The wafer level camera module of claim 1, wherein the second piezoelectric thin film is deformed so that the second deformable layer is deformed and the second lens is moved, when a driving voltage is applied to the second piezoelectric thin film through the second conductive via.

11. A wafer level camera module, comprising:
an image sensor including an imaging region;
a first support layer disposed on the image sensor and having a first opening;
a first zooming unit including:
a first piezoelectric thin film disposed on the first support layer and having a second opening;
a first deformable layer disposed on the first piezoelectric thin film; and
at least one lens attached to one surface of the first deformable layer and positioned to overlap the imaging region;
a second support layer disposed on the first deformable layer and having a third opening;
a second zooming unit including:
a second piezoelectric thin film disposed on the second support layer and having a fourth opening;
a second deformable layer disposed on the second piezoelectric thin film; and
a second lens attached to the second deformable layer and positioned to overlap the imaging region, wherein the second lens includes a first sub lens disposed on a first surface of the second deformable layer and a second sub lens disposed on a second surface of the second deformable layer;
a first conductive via electrically connected to the first piezoelectric thin film; and
a second conductive via electrically connected to the second piezoelectric thin film.

12. The wafer level camera module of claim 11, wherein the first piezoelectric thin film and second piezoelectric thin film include piezoelectric crystal, piezoelectric ceramics, polyvinylidene or copolymers.

13. The wafer level camera module of claim 11, wherein the first deformable layer and the second deformable layer include polypropylene (PP), polyvinyl chloride (PVC), polystyrene (PS), polymethyl methacrylate (PMMA) or polycarbonate (PC).

14. The wafer level camera module of claim 11, wherein the first deformable layer deforms in response to an electro-deformation of the first piezoelectric thin film.

15. The wafer level camera module of claim 14, wherein the second deformable layer deforms in response to an electro-deformation of the second piezoelectric thin film.

16. The wafer level camera module of claim 11, wherein the first piezoelectric thin film includes a first piezoelectric material layer, wherein a first electrode layer and a second electrode layer are disposed on opposite surfaces of the first piezoelectric material layer, respectively.

17. The wafer level camera module of claim 11, wherein the second piezoelectric thin film includes a second piezoelectric material layer, wherein a third electrode layer and a fourth electrode layer are disposed on opposite surfaces of the second piezoelectric material layer, respectively.

18. A wafer level camera module, comprising:
an image sensor including an imaging region;
a first support layer disposed on the image sensor and having a first opening;
a first zooming unit disposed on the first support layer, including:
a first piezoelectric thin film having a second opening;
a first deformable layer; and
a first lens attached to the first deformable layer and positioned to overlap the imaging region;
a second support layer disposed on the first zooming unit and having a third opening;
a second zooming unit disposed on the second support layer, including:
a second piezoelectric thin film having a fourth opening;
a second deformable layer; and
a second lens attached to the second deformable layer and positioned to overlap the imaging region;
a first conductive via electrically connected to the first piezoelectric thin film;
a second conductive via electrically connected to the second piezoelectric thin film;
a first external connection terminal disposed on a surface of the wafer level camera module to output an electric signal to an external device;

a third support layer disposed on the second deformable layer and having a fifth opening; and a protective layer disposed on the third support layer.

19. The wafer level camera module of claim 18, wherein the first conductive via includes a first conductive sub-via and a second conductive sub-via, and the wafer level camera module further includes a second external connection terminal including a first external connection sub-terminal connected to the first conductive sub-via and a second external connection sub-terminal connected to the second conductive sub-via.

20. The wafer level camera module of claim 18, wherein the second conductive via includes a third conductive sub-via and a fourth conductive sub-via, and the wafer level camera module further includes a third external connection terminal including a third external connection sub-terminal connected to the third conductive sub-via and a fourth external connection sub-terminal connected to the fourth conductive sub-via.

* * * * *